United States Patent
Pan et al.

(10) Patent No.: US 9,832,907 B2
(45) Date of Patent: Nov. 28, 2017

(54) SKELETON UNIT AND SKELETON UNIT ASSEMBLY

(71) Applicants: SHANGHAI PUHE TECHNOLOGY CO., LTD., Shanghai (CN); SHANGHAI ELECTRICIAN INDUSTRY & COMMERCE CO., LTD., Shanghai (CN)

(72) Inventors: Haifeng Pan, Shanghai (CN); Xiaoping Chen, Shanghai (CN)

(73) Assignees: SHANGHAI PUHE TECHNOLOGY CO., LTD., Shanghai (CN); SHANGHAI ELECTRICIAN INDUSTRY & COMMERCE CO., LTD., Shanghai (CN)

(*) Notice: Subject to any disclaimer, the term of this patent is extended or adjusted under 35 U.S.C. 154(b) by 0 days.

(21) Appl. No.: 15/119,710

(22) PCT Filed: Mar. 31, 2014

(86) PCT No.: PCT/CN2014/074434
§ 371 (c)(1),
(2) Date: Aug. 17, 2016

(87) PCT Pub. No.: WO2015/149238
PCT Pub. Date: Oct. 8, 2015

(65) Prior Publication Data
US 2017/0064861 A1 Mar. 2, 2017

(51) Int. Cl.
*E04F 15/00* (2006.01)
*H05K 7/18* (2006.01)
(Continued)

(52) U.S. Cl.
CPC ............. *H05K 7/183* (2013.01); *E04C 2/421* (2013.01); *E04F 15/02* (2013.01)

(58) Field of Classification Search
CPC .......... H05K 7/183; E04C 2/421; E04F 15/02
See application file for complete search history.

(56) References Cited

U.S. PATENT DOCUMENTS 3,148,482 A * 9/1964 Neale ...................... E01C 5/003
125/11.01
4,999,964 A * 3/1991 Taylor ...................... E04B 5/46
52/477
(Continued)

FOREIGN PATENT DOCUMENTS

| CN | 1804263 A | 7/2006 |
|---|---|---|
| CN | 102071768 A | 5/2011 |

(Continued)

*Primary Examiner* — Anita M King
(74) *Attorney, Agent, or Firm* — Im IP Law; C. Andrew Im

(57) ABSTRACT

A skeleton unit to mount mosaic plates, includes a main body section and an extension section. The main body section is integrally formed by strip pieces perpendicularly crossing each other to provide a grille shape. The extension section extends out from four edges of the main body section and is integrally formed with the main body section. The extension section includes prolongation pieces which respectively extend out from both ends of each strip piece, and parallel strips which connect with the outside ends of each prolongation piece on the same side and are in parallel with the edges of the main body section respectively. The parallel strip has lap joint hole portions, which penetrates the parallel strips and are used to overlap another skeleton unit. The sum of double the length of the prolongation piece and the width of the parallel strip is equal to the length of the grid.

9 Claims, 6 Drawing Sheets

(51) Int. Cl.
  *E04C 2/42*   (2006.01)
  *E04F 15/02*  (2006.01)

(56) References Cited

U.S. PATENT DOCUMENTS

| | | |
|---|---|---|
| 2007/0193163 A1 | 8/2007 | Busby et al. |
| 2013/0160397 A1* | 6/2013 | Fenollosa Esteve ... B29C 70/78 52/797.1 |

FOREIGN PATENT DOCUMENTS

| | | |
|---|---|---|
| CN | 202227557 U | 5/2012 |
| JP | 10-196093 A | 7/1998 |
| JP | 2002-250116 A | 9/2002 |

\* cited by examiner

SKELETON UNIT AND SKELETON UNIT ASSEMBLY

RELATED APPLICATIONS

This application is a §371 application from PCT/CN2014/074434 filed Mar. 31, 2014, which is incorporated herein by reference in its entirety.

FIELD OF THE INVENTION

The present invention relates to a support skeleton, especially relates to a skeleton unit and its skeleton unit assembly used to mount mosaic cover plates.

BACKGROUND OF THE INVENTION

An assembly panel is used widely in industries such as electric power, coal and mining, environment protection, highways, railway, aviation, chemistry and so on. For example, the assembly panel is used as a simulated screen which is an important composition part of dispatch and monitoring systems in large enterprises, or is used as an operation control panel which is set on transportation vehicles.

The assembly panel is usually a panel, which is composed of mosaic cover plates, equipped with switches, buttons, terminal boards, flash alarms, various kinds of telecommand elements, telemetering displayers and other instruments, so as to accomplish a central monitor and control on electrical equipments. Such assembly panel composed of mosaic cover plates not only has advantages of high strength, well smoothness and tiny gaps, but also has specialties that being easy to change and being convenient for changing the analog wiring diagram. Before the mosaic cover plates are assembled together in such assembly panel, a support skeleton, which is used to mount the mosaic cover plates and other control elements, is generally paved in the frame of the assembly panel.

In prior art there is a kind of support skeleton, which is moulded by a unibody casting with moulds. The size of the support skeleton is in accord with the assembly panel, and the support skeleton has plural lines of grids whose size is in accord with the mosaic cover plates. However, since the support skeleton is moulded by the unibody casting, once the area of the assembly panel becomes huge, the area of the support skeleton will be huge as well, and the support skeleton will be too bulky to carry and transport. Another kind of support skeleton, which is composed of plural skeleton pieces distributed horizontally and vertically, is also can be considered for use. The skeleton pieces are easy to carry, but for the support skeleton composed of such skeleton pieces, when a cutting process needs to be carried out for fitting the control elements, the strength of the cut position will be influenced. Especially when the cut position is close to the edge, the edge area will be too narrow or there are cut pieces left only at the edge area, therefore the strength of the support skeleton is difficult to ensure. Furthermore, for the support skeleton with a large size, a method of being composed of small size support skeletons can be considered as well. However, the small size support skeletons need to be connect by extra connection units, which are bulgy and cause a problem that the panel composed of such small size support skeletons is out of flatness.

SUMMARY OF THE INVENTION

The present invention aims at the above-mentioned problem and the purpose of the present invention is to provide a skeleton unit and its skeleton unit assembly, which are easy to transport, are high in strength and can provide a panel with high flatness.

The present invention provide a skeleton unit at least used to mount plural mosaic cover plates, comprising:

a main body section, which is integrally formed by plural strip pieces perpendicularly crossing to each other and presents a grille shape, including plural grids with size and shape corresponding to the mosaic cover plates; and an extension section, which extends out from four edges of the main body section and is integrally formed with the main body section, including: plural prolongation pieces which respectively extend out from both ends of each the strip piece, and plural parallel strips which connect with the outside ends of each the prolongation piece on the same side and are in parallel with the edges of the main body section respectively.

wherein the length of the parallel strip is equal to the length of the strip piece, the height of the parallel strip is less than half the height of the strip piece, in the extension section, two adjacent parallel strips are in alignment with the bottom surface of the main body section, and the top parts of the other two adjacent parallel strips are fixed at the positions close to the top surface of the main body section, the parallel strip is provided with plural lap joint hole portions, which penetrates the parallel strips and are used to overlap another the skeleton unit, the sum of double the length of the prolongation piece and the width of the parallel strip is equal to the length of the grid.

Further, the skeleton unit can also have the following features: the lengths of two adjacent parallel strips are equal.

Further, the skeleton unit can also have the following features: the length of one of two adjacent parallel strips is double or threefold as the length of the other one.

Further, the skeleton unit can also have the following features: the main body section is provided with plural thread fixation holes respectively penetrating at the positions where each two strip pieces perpendicularly cross.

Further, the skeleton unit can also have the following features: the lap joint hole portions on each parallel strip penetrates respectively at the positions corresponding to the prolongation pieces.

Further, the skeleton unit can also have the following features: the lap joint hole portion is provided with a lap joint hole, in the skeleton unit, two parallel strips which are in alignment with the bottom surface of the main body section are defined as first parallel strips, and two parallel strips whose top parts are fixed at the positions close to the top surface of the main body section are defined as second parallel strips, each the lap joint hole on the first parallel strip is threaded hole, each the lap joint hole on the second parallel strip is through-hole.

Further, the skeleton unit can also have the following features: each two skeleton units are connected firmly with each other by plural fastening assemblies, the fastening assembly is a screw and nut assembly, including: a screw which penetrates the through-hole and then screws into the threaded hole, and a screw nut which screws and fastens the screw on the outside of the threaded hole, the top part of the second parallel strip is fixed at the position with a distance away from the top surface of the main body section, the distance is not less than the thickness of the head of the screw.

Further, the skeleton unit can also have the following features: the main body section is formed by the perpendicularly crossing between at least three the strip pieces in horizontal direction and at least three the strip pieces in vertical direction, presents a gird shape, and includes at least four grids with size and shape corresponding to the mosaic cover plates.

Furthermore, the invention provide a skeleton unit assembly at least used to mount plural mosaic cover plates, comprising:

at least two skeleton units; and plural fastening assemblies used to connect each two adjacent skeleton units, wherein the skeleton unit is any above-mentioned skeleton unit, in each skeleton unit, two parallel strips which are in alignment with the bottom surface of the main body section are defined as first parallel strips, two parallel strips whose top parts are fixed close to the top surface of the main body section are defined as second parallel strips, two the skeleton units connect with each other firmly by the overlapping between the first parallel strips and the second parallel strips.

The Effect of the Present Invention

According to the skeleton unit and its skeleton unit assembly related in the present invention, the main body section is formed by the perpendicularly crossing of plural strip pieces, presents a grille shape and includes plural grids. The shape of the grids is corresponding to the mosaic cover plates, so each grid in the main body section can engage with one mosaic cover plate, and a flat panel is therefore formed. Since the extension section and the main body section are integrally formed by a unibody casting, the strength of the skeleton unit after necessary cutting can be also ensured.

Moreover, two adjacent parallel strips in the extension section are in alignment with the bottom surface of the main body section, the top parts of the other two adjacent parallel strips are fixed close to the main body section, and furthermore the height of each parallel strip is less than half the height of the strip piece, so plural skeleton units can connect with each other by the orderly overlapping between the parallel strips in the same vertical or horizontal direction. In two connected skeleton units, the parallel strips at the overlapping position and the adjacent prolongation pieces can compose complete grids as well, and such grids can also engage with the mosaic cover plates. Therefore the top surface of the skeleton unit assembly formed by the overlapping between plural skeleton units is still flat. When the skeleton unit assembly needs to be used for the assembly panel with large area, the transportation can be carried out easily because what needs to be transport are only skeleton units, and then the assembly panel can be formed by the overlapping of skeleton units while the skeleton units are connected firmly by the fastening assemblies.

DETAILED DESCRIPTION OF THE INVENTION

Embodiment

An embodiment of the present invention will be described in detail herein below with reference to the figures for explaining the art solution, features, purpose and effects of the present invention.

Figure 1:
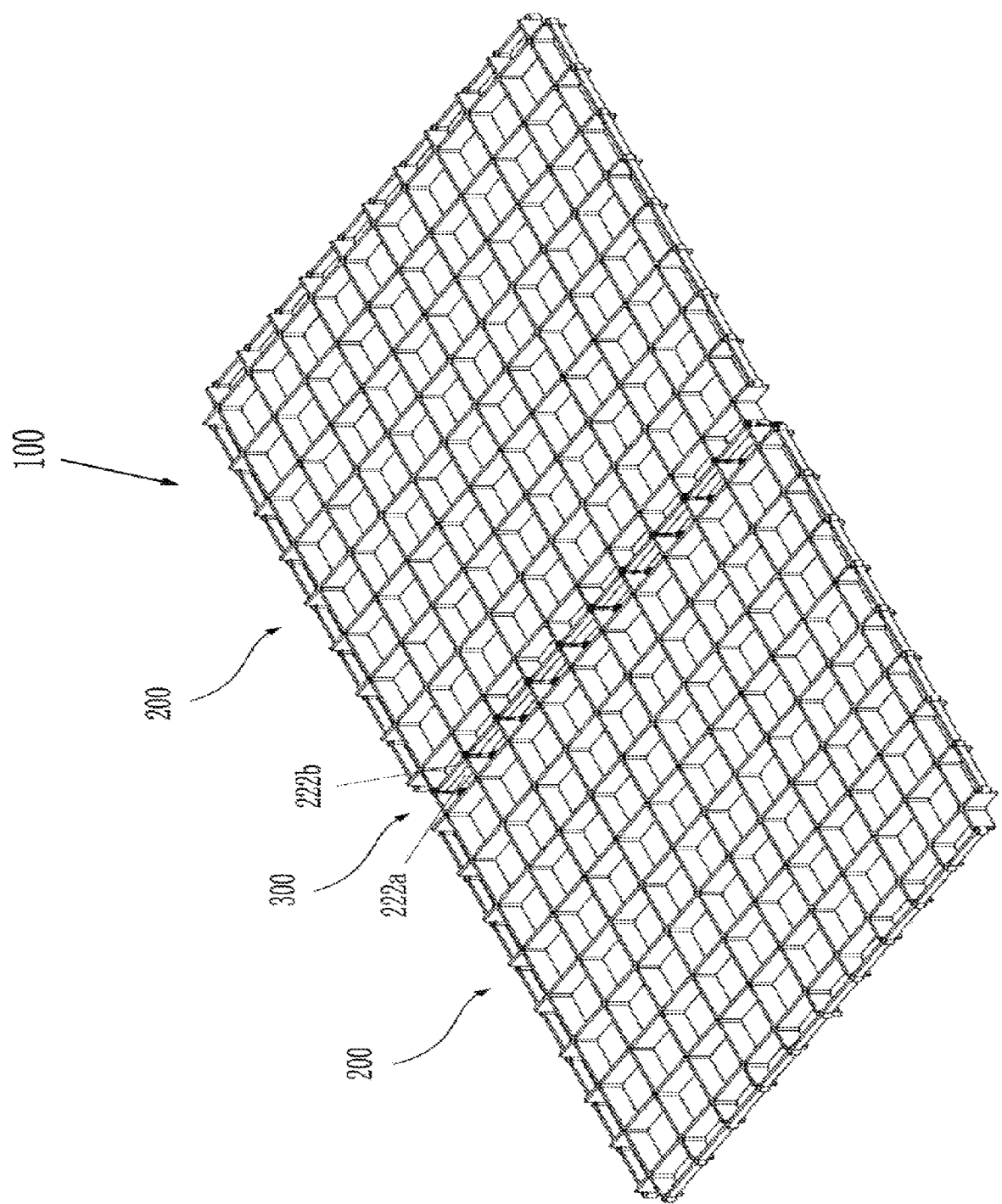
FIG. 1 is a structure illustration of the present embodiment.

FIG. 1 is a structure illustration of the present embodiment.

As shown in FIG. 1, in the present embodiment, a skeleton unit assembly 100 is at least used to mount plural mosaic cover plates, and the shape of the mosaic cover plates is square. The skeleton unit assembly 100 includes: two skeleton units 200 and plural fastening assemblies 300. The two skeleton units 200 are connected firmly by the fastening assemblies 300.

Figure 2:
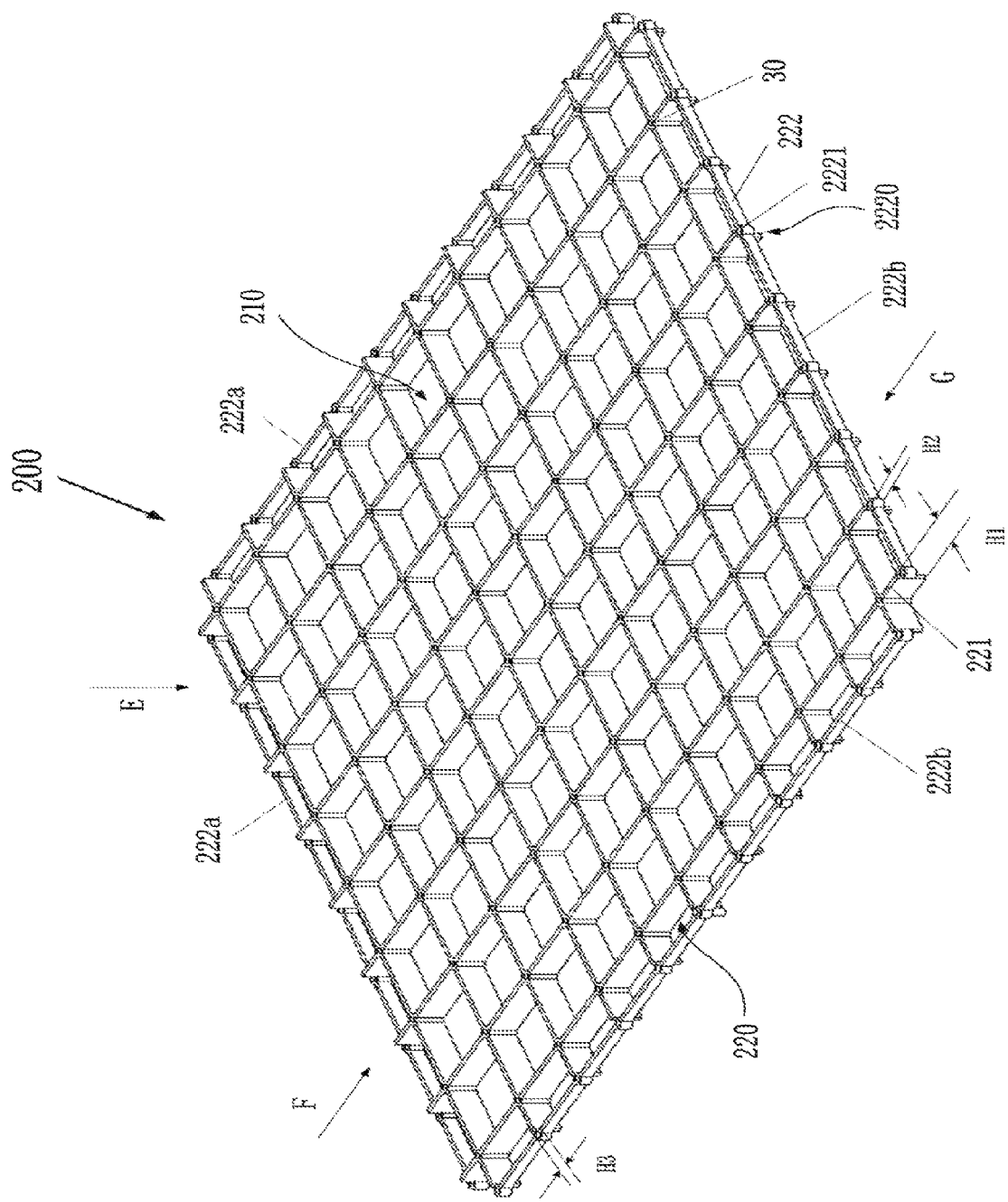
FIG. 2 is an oblique stereogram of a skeleton unit in the present embodiment.

FIG. 2 is an oblique stereogram of the skeleton unit in the present embodiment.

The assembly panel formed by the skeleton unit assembly 100 in FIG. 1 includes exactly two skeleton units 200 whose structures are the same. FIG. 2 shows only one of the two skeleton units 200. The structure and the principle of the other one is the same, so the illustration is omitted here.

As shown in FIG. 2, the skeleton unit 200 is used to mount plural mosaic cover plates, and the shape of the mosaic cover plates is square. The skeleton unit 200 includes: a main body section 210 which is used for the mounting and an extension section 220 which is located around the main body section 210.

Figure 3:
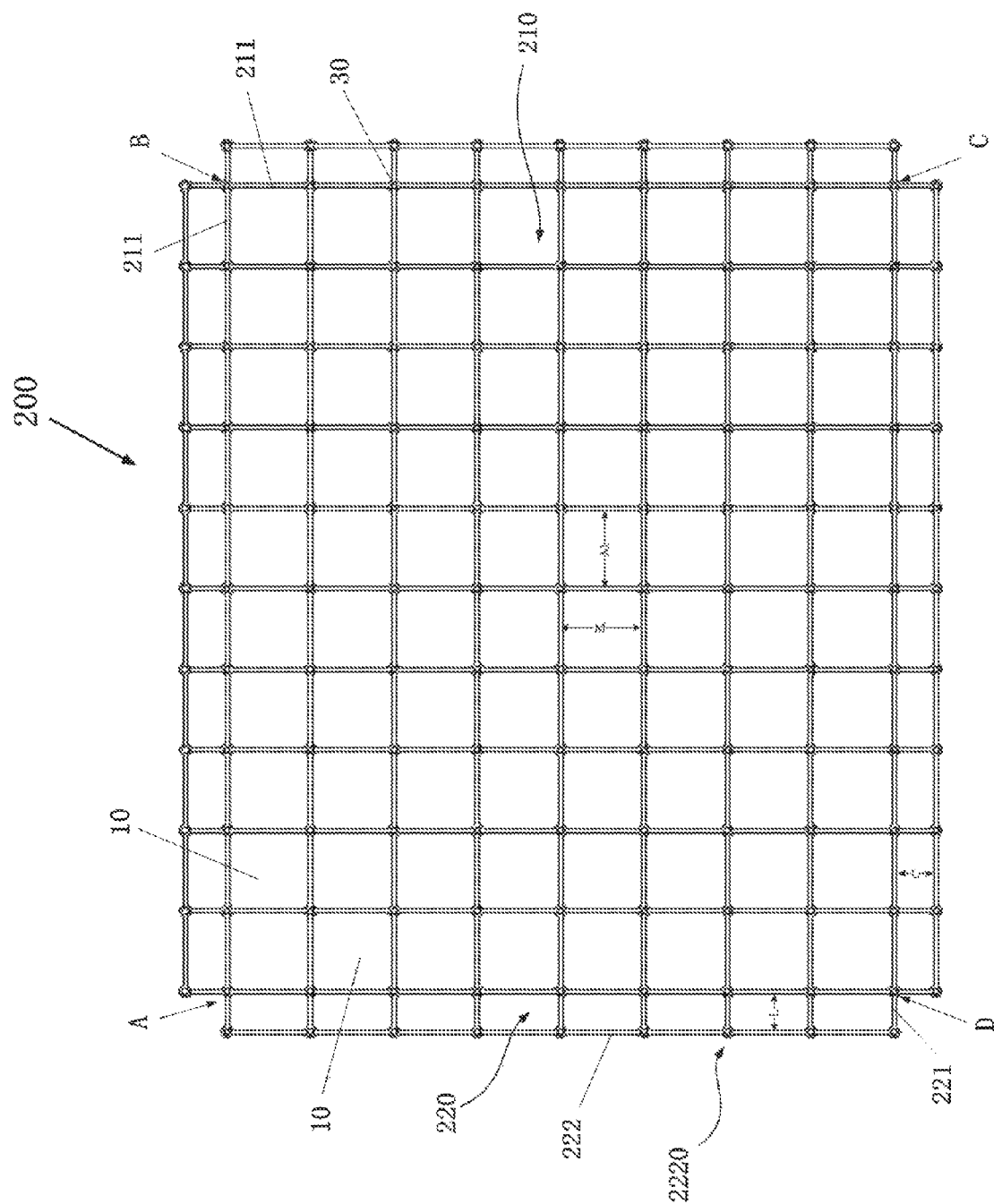
FIG. 3 is a front view of the skeleton unit in the present embodiment.

FIG. 3 is a front view of the skeleton unit in the present embodiment.

FIG. 3 is a front view, which is along the direction of arrow E in FIG. 2, of the skeleton unit 200 in the present embodiment. As shown in FIG. 3, the main body section 210 is the area figured out by the orderly linked line of the positions pointed by alphabet A, alphabet B, alphabet C and alphabet A in the figure, and the main body section 210 includes exactly nine horizontal strip pieces 211 and eleven vertical strip pieces 211.

For example, a vertical strip piece 211 is between the positions pointed by alphabet A and alphabet B, and a horizontal strip piece 211 is between the positions pointed by alphabet B and alphabet C.

The nine horizontal strip pieces 211 are parallelly placed from top to bottom as shown in FIG. 3, and the eleven vertical strip pieces 211 are parallelly placed from left to right as shown in FIG. 3. Each horizontal strip piece 211 is perpendicular to each vertical strip piece 211, and the intervals between two parallelly adjacent strip pieces 211 are equal. Namely, the interval M between two horizontal strip pieces 211 is equal to the interval M between two vertical strip pieces 211. The nine horizontal strip pieces 211 and the eleven vertical strip pieces 211 compose the main body section 210 integrally, so as to ensure a high strength of the main body section 210.

In the main body section 210, ten grids 10 are formed in the horizontal direction, and eight grids 10 are formed in the vertical direction. Eighty square grids 10 are formed integrally by the perpendicularly crossing between the nine horizontal strip pieces 211 and eleven vertical strip pieces 211, so the main body section 210 presents a grille shape and includes eighty square grids 10. Since the interval M between two adjacent strip pieces 211 is in accord with the length of the mosaic cover plate, each square grid 10 can engage with one mosaic cover plate. And as shown in FIG. 2, the height of the strip piece 211 is in accord with the height of the claws in the mosaic cover plate, so each mosaic cover plate can be engaged into the square grid 10 firmly. Therefore one single skeleton unit 200 can be paved with eighty mosaic cover plates exactly.

Plural thread fixation holes 30 are disposed respectively at the positions where each two strip pieces 211 cross perpendicularly. As shown in FIG. 2, the thread fixation hole 30 penetrates the position, where the two strip pieces 211 perpendicularly cross to each other, along the height direction of the strip piece 211. Ninety-nine perpendicularly crossing positions are formed by the perpendicularly crossing between the nine horizontal strip pieces 211 and eleven vertical strip pieces 211, and each perpendicularly crossing position is provided with one thread fixation hole 30, which means in total there are ninety-nine thread fixation holes 30 in the main body section 210. When an instrument needs to be mounted on the skeleton unit 200, the instrument can be mounted by the screws screwed into the thread fixation holes 30. The ninety-nine thread fixation holes 30 are preset for such situation.

The extension section 220 is around the main body section 210, and is formed by the extension of four edges of the main body section 210. Such integrated structure makes a high strength of the skeleton unit 200.

The extension section 220 includes: parallel strips 222, and plural prolongation piece 221 at the directions of up, down, left and right. The prolongation piece 221 is formed by the extension of a distance L, which any horizontal or vertical strip piece 221 extends outside from its end.

The left part in FIG. 3 is taken as an example to explain. One end of each horizontal strip piece 211 respectively extends the distance L leftwards, and the nine prolongation pieces 221 are therefore formed. Meanwhile, the parallel strip 222 connects with each end of the nine prolongation pieces 221. And the parallel strip 222 is in parallel with the left edge, which is between the positions pointed by the alphabet A and the alphabet B, of the main body section 210. Furthermore, the length of the parallel strip 222 is equal to the length of the vertical strip piece 211, which means that the length of the parallel strip 222 is equal to the strip piece 211 between the positions pointed by the alphabet A and the alphabet B.

The bottom part in FIG. 2 is taken as an example to explain. One end of each vertical strip piece 211 respectively extends the distance L downwards, and the eleven prolongation pieces 221 are therefore formed. Meanwhile, the parallel strip 222 connects with each end of the eleven prolongation pieces 221. And the parallel strip 222 is in parallel with the left edge, which is between the positions pointed by the alphabet C and the alphabet D, of the main body section 210. Furthermore, the length of the parallel strip 222 is equal to the length of the horizontal strip piece 211, which means that the length of the parallel strip 222 is equal to the strip piece 211 between the positions pointed by the alphabet C and the alphabet D.

From the foregoing, the extension section 220 of one single skeleton unit 200 includes forty prolongation pieces 221 and four parallel strips 222. Each parallel strip 222 is provided with plural lap joint hole portions 2220.

The vertical parallel strip 222 on the right in FIG. 2 and FIG. 3 is taken as an example to explain. The vertical parallel strip 222 connects with each end of the prolongation pieces 221, and is provided with lap joint hole portions 2220 respectively at the positions corresponding to each prolongation piece 221. So in total there are nine lap joint hole portions 2220 on the vertical parallel strip 222. The lap joint hole portion 2220 is cylinder-shaped, and each lap joint hole portion 2220 is penetrated by a lap joint hole 2221.

Similarly, as shown in FIG. 2 and FIG. 3, the vertical parallel strip 222 on the left, the horizontal parallel strip 222 on the top and the horizontal parallel strip 222 on the bottom can connect firmly to the adjacent skeleton units 200 in four directions (not shown in the figures) by their parallel strips 222.

In the present embodiment, the upward direction in FIG. 2 is the top surface of the skeleton unit 200 for mounting the mosaic cover plates. In other words, in the main body section 210, the surface for mounting the mosaic cover plates is the top surface, and the opposite surface is the bottom surface. So in FIG. 2, the top surface is upward, and the bottom surface is downward.

As shown in FIG. 2, since two adjacent skeleton units 200 connect each other by the overlapping between the parallel strips 222, so the height H2 of each parallel strip 222 is preset to be less than half the height H1 of the strip piece 211 for the purpose of flatness. What needs to be especially explained is that, in extension section 220, the horizontal parallel strip 222 on the top and the vertical parallel strip 222 on the left are in alignment with the bottom surface of the main body section 210. The top part of the horizontal parallel strip 222 on the bottom and the top part of the vertical parallel strip 222 on the right are fixed at the positions with a distance H3 away from the top surface of the main body section 210.

Figure 4:
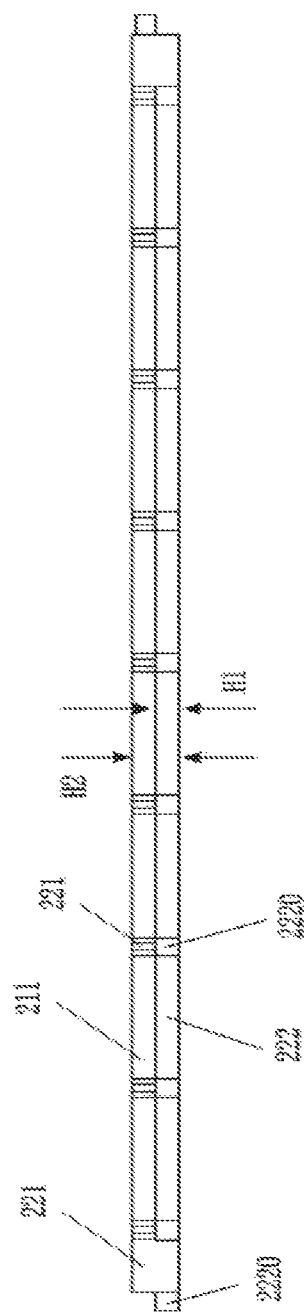
FIG. 4 is a side view of the skeleton unit from one side in the embodiment.

FIG. 4 is a side view of the skeleton unit from one side in the embodiment.

FIG. 4 is a side view, which is viewed from the direction of arrow F in the FIG. 2, of the skeleton unit 200. As shown in FIG. 4, the parallel strip 222 is in alignment with the bottom surface of the main body section 210. The positions of lap joint hole portions 2220 on the above-mentioned parallel strip 222 are corresponding to the positions of the prolongation pieces 221 respectively, and the height H2 of the parallel strip 222 is less than half the height H1 of the strip piece 211. As shown in the figure, the parallel strip 222 on the left side of the above-mentioned parallel strip 222 is in alignment with the bottom surface of the main body section 210 as well. The positions of the two above-mentioned parallel strips 222 are the same relative to the main body section 210, namely they are all in alignment with the bottom surface of the main body section 210.

Figure 5:
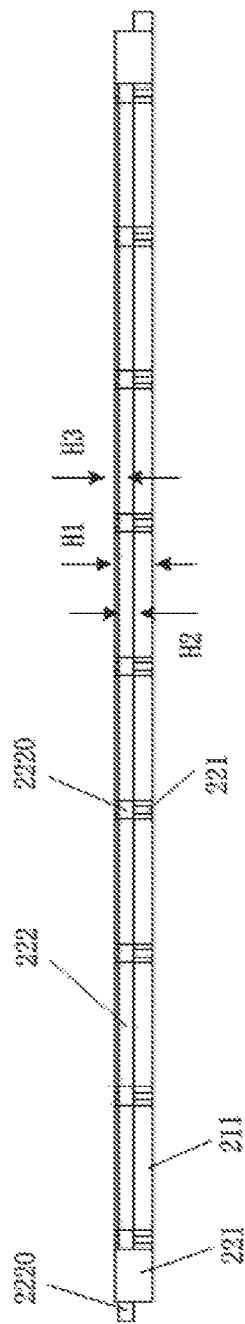
FIG. 5 is a side view of the skeleton unit from another side in the embodiment.

FIG. 5 is a side view of the skeleton unit from another side in the embodiment.

FIG. 5 is a side view, which is viewed from the direction of arrow G in the FIG. 2, of the skeleton unit 200. As shown in FIG. 5, the top part of the horizontal parallel strip 222 is fixed at the position with the distance H3 away from the top surface of the main body section 210. The positions of lap joint hole portions 2220 on the above-mentioned parallel strip 222 are corresponding to the positions of the prolongation pieces 221 respectively, and the height H2 of the parallel strip 222 is less than half the height H1 of the strip piece 211. As shown in the figure, the top part of the parallel strip 222, which is on the left side of the above-mentioned parallel strip 222, is also fixed at the position with the distance H3 away from the top surface of the main body section 210. The positions of the two above-mentioned parallel strips 222 are the same relative to the main body section 210, namely the top parts of them are all fixed at the positions with the distance H3 away from the top surface of the main body section 210.

According to FIG. 4 and FIG. 5, in the skeleton unit 200, two adjacent parallel strips 222 are in alignment with the bottom surface of the main body section 210, and the top parts of the other two adjacent parallel strips 222 are fixed at the positions with the preset distance H3 away from the top surface of the main body section 210.

As shown in FIG. 2, in the extension section 220 of the present embodiment, the vertical parallel strip 222 on the left and the horizontal parallel strip 222 on the top, which are in alignment with the bottom surface of the main body section 210, are defined as first parallel strips 222a. The vertical parallel strip 222 on the right and the horizontal parallel strip 222 on the bottom, whose top parts are fixed at the positions with the distance H3 away from the top surface of the main body section 210, are defined as second parallel strips 222b. Each lap joint hole 2221 on the first parallel strips 222a is threaded hole, and each lap joint hole 2221 on the second parallel strips 222b is through-hole.

As shown in FIG. 1, the skeleton unit 200 is formed by the overlapping between two skeleton units 200. When two skeleton units 200 overlap and connect with each other, the overlapping can be performed by the lapping of the first parallel strips 222a in the left skeleton unit 200 and the corresponding second parallel strips 222b in the right skeleton unit 200. After the lapping, ten "half grids", which are formed by the first parallel strips 222a and the eleven prolongation pieces 221 attached thereto, and ten "half grids", which are formed by the second parallel strips 222b and the eleven prolongation pieces 221 attached thereto, lap and form ten complete grids. Since the sum of double the length L of one single prolongation piece 221 and the width of one single parallel strip 222 is in accord with the length of the mosaic cover plate, each complete grid can engage with one mosaic cover plate exactly.

Since one single skeleton unit 200 can be paved with eighty mosaic cover plates, and ten complete grids, which can engage and fit with mosaic cover plates as well, are formed after two skeleton unit 200 overlap and connect with each other, so in total the skeleton unit assembly 100 can be paved with one hundred and seventy mosaic cover plates exactly.

Figure 6:
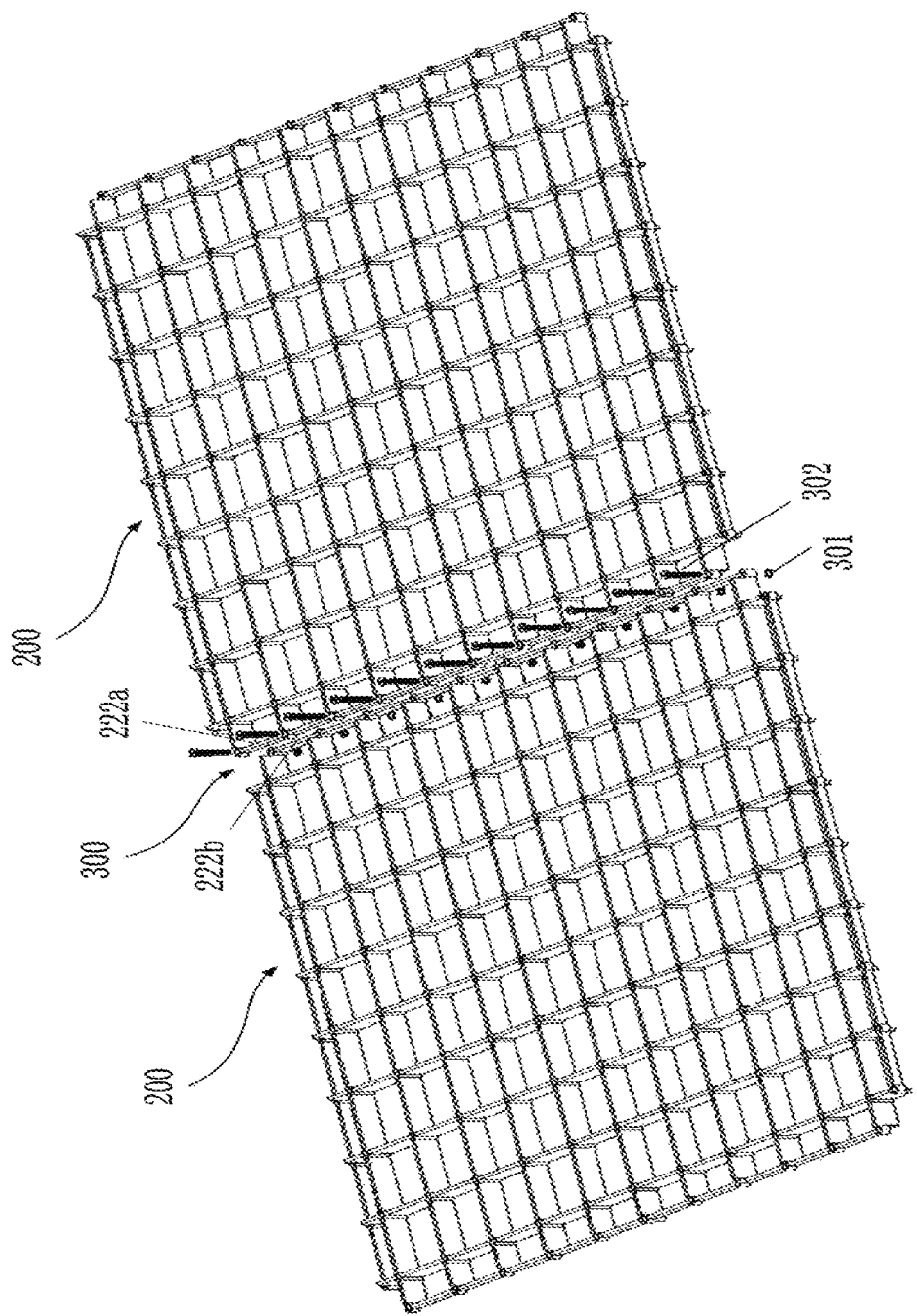
FIG. 6 is an explosive view of the skeleton unit assembly in the present embodiment.

FIG. 6 is an explosive view of the skeleton unit assembly in the present embodiment.

As shown in FIG. 6, in two connected skeleton units 200, the first parallel strips 222a in the left skeleton unit 200 and the second parallel strips 222b in the right skeleton unit 200 overlap and connect with each other. Thus the axial direction of the threaded hole on the first parallel strips 222a and the axial direction of the through-hole on the second parallel strips 222b are in alignment. So a fastening assembly 300 can be used for a fastening connection of the threaded hole and the through-hole.

The fastening assembly 300 includes: a screw 301 and a screw nut 302.

In the present embodiment, the screw 301 is a slotted flat head screw. On the premise that the flatness of the panel formed by the two skeleton units 200 is not influenced, the distance H3 between the main body section 210 and the top parts of the second parallel strips 222b is not less than the thickness of the head of the screw, so that a space is preset for the head of the screw 301.

In the screw 301, the length of the thread part should not be less than the height sum of the through-hole, the threaded hole and the screw nut 302. The screw 301 passes through the through-hole on the second parallel strip 222b, screws into the threaded hole, then screws out of the threaded hole, furthermore fits with the screw nut 302. Therefore the screw 301 is screwed and fastened by the screw nut 302. Consequently the through-hole and the threaded hole are attached firmly, so as to ensure that the two skeleton units 200 are connected firmly.

For mounting the display screens or other instruments, the skeleton unit 200 needs to be hollowed out by means of cutting. Since the skeleton unit 200 is moulded by a unibody casting, after the cutting the strength of the skeleton unit 200 can be ensured as well. Furthermore, the skeleton unit 200 is moulded by the unibody casting, so when the shape requirement on the skeleton unit changes, the skeleton unit with the changed shape can also be moulded by the unibody casting, therefore the strength of the skeleton unit can be further ensured.

If the panel needed is huge, the skeleton unit assembly 100 can be formed by the assembling of plural skeleton units 200, in which each adjacent skeleton units 200 overlaps with another and then is connected by the fastening assemblies 300. When the skeleton unit assemblies 100 needs to be transported, only the skeleton units 200 need to be transported and then can be connected and fastened by the fastening assemblies 300 to form the panel. So the disassembly and transportation of such skeleton unit assemblies is easy to carry out.

Function and Effects of the Present Embodiment

According to the skeleton unit and its skeleton unit assembly in the present embodiment, the main body section is formed by the perpendicularly crossing of plural strip pieces, presents a grille shape and includes plural grids with shape corresponding to the mosaic cover plates, so each grid in the main body section can engage with one mosaic cover plate, and a flat panel is therefore formed. Since the extension section and the main body section are formed by a unibody casting, the strength of the skeleton unit after necessary cutting can be also ensured.

Moreover, two adjacent parallel strips in the extension section are in alignment with the bottom surface of the main body section, the top parts of the other two adjacent parallel strips are fixed close to the top surface of the main body section, and furthermore the height of each parallel strip is less than half the height of the strip piece, so plural skeleton units can connect with each other by the orderly overlapping of the parallel strips in the same vertical or horizontal direction. In two connected skeleton units, the parallel strips at the overlapping positions and the adjacent prolongation pieces can compose plural grids as well, and such grids can also engage with the mosaic cover plates. Therefore the top surface of the skeleton unit assembly formed by the overlapping of plural skeleton units is still flat. When the skeleton unit assembly needs to be used for the assembly panel with large area, the transportation can be carried out easily because what need to be transport are only skeleton units, and the assembly panel can be formed by the overlapping of skeleton units connected by the fastening assemblies.

In the skeleton unit of the present embodiment, since main body section is provided with threaded holes penetrating at the positions where each two strip pieces perpendicularly cross, the needed instruments can be mounted onto the skeleton unit and its skeleton unit assembly conveniently and quickly.

The above-mentioned embodiment is a prefer solution of the present invention, and of course the skeleton unit assembly and the skeleton unit related to the present invention are not limited to the structures in the above-mentioned embodiment.

In the present embodiment, the main body section is composed of nine horizontal strip pieces and eleven vertical strip pieces, presents a grille shape and includes eighty grids. However, in the skeleton unit offered in the present invention, the main body section can be composed of at least three horizontal strip pieces and three vertical strip pieces, presents the grille shape and includes at least four grids.

In the present embodiment, the main body section present a rectangle shape and includes ten grids in horizontal direction and eight grids in vertical direction. However, in the skeleton unit offered in the present invention, the main body section can present a square shape and includes grids in horizontal direction equal to grids in vertical direction, or another rectangle shape in which the number of grids in one direction are double or threefold as the number of grids in the other direction. Therefore the skeleton unit and the skeleton unit assembly can be used in the panels with irregular shapes.

In the present embodiment, the positions of the lap joint hole portions on each parallel strip are corresponding to the prolongation pieces respectively. However, in the skeleton unit offered in the present invention, the lap joint hole portions can be at any positions on the parallel strips.

In the present embodiment, the height of the parallel strip is less than half the height of the strip piece. However, in the skeleton unit offered in the present invention, the height of the parallel strip can be equal to half the height of the strip piece.

In the present embodiment, to preset a space for the screw head and then to make sure the panel formed with the mosaic cover plates is flat, the top parts of the two adjacent parallel strips are fixed at the position with the distance away from the top surface of the main body section. However, in the skeleton unit offered in the present invention, the thickness of the screw head can be ignored and the space for screw head can be not preset.

In the present embodiment, the screw is a slotted flat head screw. However, in the skeleton unit and the skeleton unit assembly offered in the present invention, the screw can be a flat head screw with a cruciform slot as well.

The invention claimed is:

1. A skeleton unit to mount a plurality of mosaic cover plates, comprising:
    a main body section, which is integrally formed by a plurality of strip pieces perpendicularly crossing each other to present a grille shape, comprising a plurality of grids with a size and a shape corresponding to the mosaic cover plates;
    an extension section, which extends out from four edges of the main body section and is integrally formed with the main body section, the extension section comprises a plurality of prolongation pieces which respectively extend out from both ends of each strip piece, and a plurality of parallel strips which connect with outside ends of each prolongation piece on a same side and are in parallel with the edges of the main body section, respectively;
    wherein a length of a parallel strip is equal to a length of a strip piece, a height of the parallel strip is less than half a height of the strip piece;
    wherein first two adjacent parallel strips are in an alignment with a bottom surface of the main body section, and top parts of second two adjacent parallel strips are fixed at positions close to a top surface of the main body section;
    wherein the parallel strip is provided with a plurality of lap joint hole portions penetrating the parallel strips and are used to overlap another skeleton unit; and
    wherein a sum of twice a length of a prolongation piece and a width of the parallel strip is equal to a length of a grid.

2. The skeleton unit according to claim 1, wherein lengths of the first and second two adjacent parallel strips are equal.

3. The skeleton unit according to claim 1, wherein a length of one of the first and second two adjacent parallel strips is double or threefold as a length of the other adjacent two parallel strips.

4. The skeleton unit according to claim 1, wherein the main body section is provided with a plurality of thread fixation holes respectively penetrating at positions where two strip pieces perpendicularly cross each other.

5. The skeleton unit according to claim 1, wherein said plurality of the lap joint hole portions on said each parallel strip penetrates respectively at positions corresponding to the prolongation pieces.

6. The skeleton unit according to claim 1, wherein each lap joint hole portion is provided with a lap joint hole, each lap joint hole on the first two adjacent parallel strips is a threaded hole, and each lap joint hole on the second two adjacent parallel strips is a through-hole.

7. The skeleton unit according to claim 6, further comprising a plurality of fastening assemblies to connect the skeleton unit to another skeleton unit, each fastening assembly is a screw and nut assembly comprising a screw which penetrates the through-hole and screws into the threaded hole, and a screw nut which screws and fastens the screw on outside of the threaded hole; and wherein the top parts of the second two adjacent parallel strips are fixed at a position that is a predetermined distance away from the top surface of the main body section, the predetermined distance being not less than a thickness of a head of the screw.

8. The skeleton unit according to claim 1, wherein the main body section is formed by the perpendicularly crossings of at least three strip pieces in a horizontal direction and at least three strip pieces in a vertical direction to present the grille shape, and the main body section comprises at least four grids with the size and the shape corresponding to the mosaic cover plates.

9. A skeleton unit assembly to mount a plurality of mosaic plates, comprising:
    at least two skeleton units according to claim 1;
    a plurality of fastening assemblies to connect each two adjacent skeleton units; and
    wherein said at least two skeleton units connect to each other by overlapping between the first two adjacent parallel strips and the second two adjacent parallel strips.

* * * * *